United States Patent
Holloway et al.

(10) Patent No.: US 10,593,901 B2
(45) Date of Patent: Mar. 17, 2020

(54) PROCESSES FOR IMPROVING EFFICIENCY OF LIGHT EMITTING DIODES

(71) Applicant: NANOPHOTONICA, INC., Lake Mary, FL (US)

(72) Inventors: Paul H. Holloway, Gainesville, FL (US); Jake Hyvonen, Gainesville, FL (US); Jesse R. Manders, Gainesville, FL (US); Alexandre Titov, Gainesville, FL (US); Jean Tokarz, Hawthorne, FL (US); Krishna Acharya, Gainesville, FL (US)

(73) Assignee: NanoPhotonica, Inc., Lake Mary, FL (US)

( * ) Notice: Subject to any disclaimer, the term of this patent is extended or adjusted under 35 U.S.C. 154(b) by 0 days.

(21) Appl. No.: 15/575,700

(22) PCT Filed: May 20, 2016

(86) PCT No.: PCT/US2016/033405
§ 371 (c)(1),
(2) Date: Nov. 20, 2017

(87) PCT Pub. No.: WO2016/187492
PCT Pub. Date: Nov. 24, 2016

(65) Prior Publication Data
US 2018/0212177 A1     Jul. 26, 2018

Related U.S. Application Data

(60) Provisional application No. 62/164,104, filed on May 20, 2015.

(51) Int. Cl.
*H01L 51/50*     (2006.01)
*F21V 7/22*     (2018.01)
(Continued)

(52) U.S. Cl.
CPC .............. *H01L 51/502* (2013.01); *F21V 7/22* (2013.01); *H01L 33/06* (2013.01); *H01L 33/14* (2013.01);
(Continued)

(58) Field of Classification Search
CPC ....... H01L 51/502; H01L 33/06; H01L 33/14; H01L 33/36; H01L 33/504; H01L 33/505;
(Continued)

(56) References Cited

U.S. PATENT DOCUMENTS

| | | |
|---|---|---|
| 5,030,536 A | 7/1991 | Pai et al. |
| 5,923,946 A | 7/1999 | Negley |

(Continued)

FOREIGN PATENT DOCUMENTS

| | | |
|---|---|---|
| EP | 1516944 A1 | 3/2005 |
| EP | 2803714 A1 | 11/2014 |
| WO | 2011005859 A2 | 1/2011 |

OTHER PUBLICATIONS

International Search Report dated Aug. 22, 2016 for PCT/US16/33405.

*Primary Examiner* — Shahed Ahmed
(74) *Attorney, Agent, or Firm* — Maxwell L. Minch; GrayRobinson, P.A.

(57) ABSTRACT

A process for improving the external quantum efficiency of a light emitting diode (LED) is provided by exposing one or more components of an LED, a partially assembled LED, or a completely assembled LED to an amount of hydrogen or hydrogen gas, or to an atmosphere containing higher quantities of hydrogen or hydrogen gas for a period of exposure time. Kits and processes for constructing a light emitting diode having an improved external quantum efficiency is further provided, which includes exposing one or more components of an LED, a partially assembled LED, or a (Continued)

completely assembled LED to an amount of hydrogen or hydrogen gas, or to an atmosphere containing higher quantities of hydrogen or hydrogen gas for a period of exposure time.

16 Claims, 8 Drawing Sheets

(51) Int. Cl.
| | |
|---|---|
| *H01L 33/06* | (2010.01) |
| *H01L 33/14* | (2010.01) |
| *H01L 33/36* | (2010.01) |
| *H01L 33/50* | (2010.01) |
| *H01L 33/60* | (2010.01) |

(52) U.S. Cl.
CPC ............ *H01L 33/36* (2013.01); *H01L 33/504* (2013.01); *H01L 33/505* (2013.01); *H01L 33/60* (2013.01)

(58) Field of Classification Search
CPC ....... H01L 33/60; H01L 33/005; H01L 33/30; H01L 33/32; H01L 33/007; H01L 33/025; H01L 33/00–33/648; H01L 27/15–27/156; H01L 2933/00–2933/0091
See application file for complete search history.

(56) References Cited

U.S. PATENT DOCUMENTS

| | | | |
|---|---|---|---|
| 5,932,896 A * | 8/1999 | Sugiura | B82Y 20/00 257/94 |
| 2004/0109483 A1 | 6/2004 | Simpson et al. | |
| 2006/0071218 A1* | 4/2006 | Takeda | B82Y 10/00 257/79 |
| 2008/0283388 A1* | 11/2008 | Yamamoto | G01N 21/783 204/192.12 |
| 2010/0007267 A1 | 1/2010 | Imai et al. | |

* cited by examiner

PROCESSES FOR IMPROVING EFFICIENCY OF LIGHT EMITTING DIODES

CROSS-REFERENCE TO RELATED APPLICATIONS

The present application claims priority of U.S. Provisional patent application No. 62/164,104 filed May 20, 2015, the contents of which are herein incorporated by reference.

GOVERNMENT SUPPORT

This invention was made with Government support under SBIR Phase II Grant Number 1353411 awarded by the National Science Foundation. The Government has certain rights in this invention.

FIELD OF THE INVENTION

The present invention relates in general to processes for making light emitting diodes (LED's) and in particular to fabrication processes to improve LED efficiency.

BACKGROUND OF THE INVENTION

Light emitting diodes ("LEDs") are technologically and economically advantageous solid state light sources. LEDs are capable of reliably providing light with high brightness, hence in the past decades they have come to play a critical role in numerous applications, including flat-panel displays, traffic lights, and optical communications. When driven by a current, electrons and holes are injected into the junction region, where they recombine, releasing their energy by emitting photons. The efficiency of LEDs has important consequences on such applications. Conventional surface-emitting LEDs with high internal efficiencies suffer from relatively low external quantum efficiency. Quantum Dot LEDs, for example, exhibit external quantum efficiency of about 2-5%. These low external quantum efficiencies are independent of LED configuration, which may be bottom emitting, top emitting and/or inverted configuration.

External quantum efficiency is the ratio of the number of photons emitted from an LED to the number of electrons injected into the LED. External quantum efficiency quantifies how efficiently an LED device coverts electrons to photons and allows them to escape in the form of visible light, or in some cases, infrared light. One way in which improved external quantum efficiency can be observed in by an increase of optical output by a positive aging effect.

External quantum efficiency is a function of injection efficiency, internal quantum efficiency and extraction efficiency. Internal quantum efficiency is the proportion of all electron-hole recombination in the active region that produces photons, while extraction efficiency is the proportion of photons generated in the active region that escape from the device. Certain approaches have been attempted to increase external quantum efficiency such as roughening one LED surface and applying a back mirror. This causes reflection of light that is normally internally reflected within the LED, to escape the LED increasing the light intensity, thus improving the extraction efficiency, and the external quantum efficiency.

Methods to maximize internal quantum efficiency and injection efficiency and external quantum efficiency are relatively well known in the art. Internal quantum efficiency and injection efficiency can be maximized by material selection for the appropriate bandgap, HOMO (highest occupied molecular orbital) and LUMO (lowest unoccupied molecular orbital) levels for organic layers, electron affinity, ionization potential, and work function for an inorganic layer during the construction of a device. Some methods have been used to increase external quantum efficiency such as using back mirrors, etched waveguides, reflective substrates or reflective intermediate layers within a LED, with limited success. Notwithstanding, to date no one has examined the effects of the fabrication process on an LED's external quantum efficiency.

It is noted that certain improvements to an LED's external quantum efficiency has been made through the use of Quantum dot light emitting diodes. Quantum dot light emitting diodes (QD-LEDs) have been developed for display and lighting sources. Inorganic quantum dot light emitters have a few advantages over organic light emitting diodes (OLEDs) and other light-emitting diodes, more important of which is excellent color purity. Quantum dots (QDs) are semiconductor nanocrystallites whose radii are smaller than the bulk exciton Bohr radius. Quantum confinement of electrons and holes in all three dimensions leads to an increase in the effective band gap of the QDs with decreasing crystallite size, where the optical absorption and emission of quantum dots shift to higher energies (blue shift) as the size of the dots decreases. For example, a CdSe QD can emit light in any monochromatic visible color depending only on the size of the QD and can be used to form QD-LEDs arrays that emit white light. The emission color of quantum dot can also be tuned by its composition. For example, $ZnxCd1-xS$ emits blue, $ZnxCd1-xSySe1-y$ emits green, and $ZnxCd1-xSe$ emits red. Suitable quantum dots are taught in US 2012/0138894 A1, which is incorporated herein in its entirety. It is appreciated that use of quantum dots improves devices external quantum efficiency. Nanoparticles are also known for improving the characteristics of devices. In particular, the incorporation of zinc oxide nanoparticles into LED devices further improves the efficiency and lifetime of LED devices Notwithstanding, there still remains an unmet need to improve the external quantum efficiency of LEDs in the fabrication process of the components of the LED, such as the anode, the cathode, or quantum dots, to name a few. There further remains an unmet need to provide a method to assist in improving an aged LED's external quantum efficiency.

SUMMARY OF THE INVENTION

A process for improving the external quantum efficiency of a light emitting diode (LED) is provided by exposing one or more components of an LED, a partially assembled LED, or a completely assembled LED to an amount of hydrogen or hydrogen gas, or to an atmosphere containing higher quantities of hydrogen or hydrogen gas for a period of exposure time. Kits and processes for constructing a light emitting diode having an improved external quantum efficiency are further provided, which includes exposing one or more components of an LED, a partially assembled LED, or a completely assembled LED to an amount of hydrogen or hydrogen gas, or to an atmosphere containing higher quantities of hydrogen or hydrogen gas for a period of exposure time.

Exposing one or more components of an LED, a partially assembled LED, or a completely assembled LED to an amount of hydrogen or hydrogen gas, or to an atmosphere containing higher quantities of hydrogen or hydrogen gas for a period of exposure time has shown to improve the external quantum efficiency for a typical LED or QD-LED to near a 10× improvement, showing external quantum efficiency upwards of 18% to 20%.

BRIEF DESCRIPTION OF THE DRAWINGS

The present invention is further detailed with reference to the following figures. These figures are not intended to be a limitation on the scope of the invention, but rather to illustrate specific aspects of the invention.

FIGS. 7A and 7B illustrate spread in device performance.

DETAILED DESCRIPTION OF THE INVENTION

The present invention has utility as providing an LED with superior external quantum efficiency relative to conventional LEDs. The present invention achieves superior performance through exposing the components of the LEDs during fabrication, or though exposing a partially assembled or completely assembled LED. Notwithstanding, there still remains an unmet need to improve the external quantum efficiency of LEDs in the fabrication process of the components of the LED, such as the anode, the cathode, or quantum dots, to name a few. There further remains an unmet need to provide a method to assist in improving an aged LEDs. Without being bound by any particular theory, it is believed that by exposing the components of an LED during the fabrication of one or more of the components, or during the fabrication of an LED, or by exposing a partially assembled or completely assembled LED, that the hydrogen interacts with interface, surface and/or bulk defect states through a bonding process with a subsequent reduction in the negative effects of these defect states.

The following detailed description is merely exemplary in nature and is in no way intended to limit the scope of the invention, its application, or uses, which may vary. The invention is described with relation to the non-limiting definitions and terminology included herein. These definitions and terminology are not designed to function as a limitation on the scope or practice of the invention, but are presented for illustrative and descriptive purposes only.

As used herein "one or more components of an LED" shall mean at least one glass cover, at least one quantum dot, at least one nanoparticle, at least one quantum dot layer, at least one nanoparticle layer, at least one cathode, at least one electron transport layer, at least one emission layer, at least one hole transport layer, at least one hole injection layer, at least one anode, at least one substrate, at least one intermediate layer, and at least one metal layer.

As used herein "positive aging effect" shall mean the phenomenon where current efficiency, power efficiency and/or external quantum efficiency improve over time.

As used herein "atmosphere containing higher quantities of hydrogen" shall mean a defined space which contains an increased hydrogen concentration than normally found in air. In at least one embodiment an atmosphere containing higher quantities of hydrogen includes a glove box or polycarbonate chamber that contains some amount of hydrogen, whether the hydrogen is diatomic or monatomic hydrogen gas, and whether the hydrogen isotopes are deuterium, tritium, protium, or a combination thereof. In some embodiments the atmosphere containing higher quantities of hydrogen includes an $N_2H_2$ gas mixture, with a $H_2$ concentration of 20% or higher. In some embodiments the hydrogen or hydrogen gas is an activated hydrogen or hydrogen gas. It is appreciated that atmosphere may be in a vacuum, atmospheric pressure, or pressurized.

As used herein "forming gas" shall mean a mixture of hydrogen (mole fraction varies) and nitrogen gas.

As used herein "activated hydrogen" shall mean a hydrogen molecule ($H_2$) where at least one of the electrons in the pair which binds the individual hydrogen atoms is excited, generating a pair of free hydrogen atoms that are energetically unfavorable and therefore quite reactive. Without being bound by any particular theory, hydrogen activation can occur where the bond in an $H_2$ molecule is cleaved by a photon of necessary energy (the bond dissociation energy of $H_2$ is 4.52 eV, which would require a photon wavelength of 274 nm). In some embodiments a mercury discharge lamp generating photons of 274 nm wavelength is used to generate an amount of activated hydrogen.

As used herein, "polycarbonate chamber" shall mean a sealable enclosure which may further include desiccants used for preserving moisture-sensitive items such as cobalt chloride paper for another use. A common use for a polycarbonate chamber is to protect chemicals which are hygroscopic or which react with water from humidity.

As used herein, a "completely assembled LED" shall mean an LED containing at least at least one anode, at least one cathode, at least one p-type material, and at least one n-type material. In at least one embodiment a completely assembled LED includes at least one anode, at least one cathode, at least one electron transport layer, at least one hole transport layer and at least one emission layer. In other embodiments, a completely assembled LED includes at least one substrate, at least one anode, at least one hole injection layer, at least one hole transport layer, at least one quantum dot emitting layer, at least one electron transport layer, at least one cathode, and at least one cover glass. It is appreciated that cover glass may be a flat glass or cavity glass depending on the encapsulation method.

As used herein, a "partially assembled LED" shall mean the connection or bonding of at least two of any of the components of an LED. In at least one embodiment a partially assembled LED includes at least one substrate, at least one anode, at least one hole injection layer, at least one hole transport layer, at least one quantum dot emitting layer, at least one electron transport layer, and at least one cathode, while not including at least one cover glass.

As used herein, a "degraded LED" or "degraded components" include any components of an LED, partially assembled LED, or completely assembled LED in which performance characteristics are below normal performance characteristics for the component, partially assembled devices, or completely assembled devices. In some embodiments an LED or component becomes degraded from extended use, or exposure to high currents or high ambient temperatures.

It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

A method for improving the efficiency of a light emitting diode (LED) is provided which includes exposing one or more components of an LED, a partially assembled LED, or a completely assembled LED to an amount of hydrogen or hydrogen gas. Alternative embodiments of the invention include exposing one or more components of an LED, a partially assembled LED, or a completely assembled LED to an atmosphere containing higher quantities of hydrogen or hydrogen gas. In at least one embodiment, the exposing of the one or more components of an LED, a partially assembled LED, or a completely assembled LED for a period of exposure time. Without being bound to any particular theory, it is believed that by exposing LED components or exposing partially or completely assembled LEDs to hydrogen, causes a bonding of hydrogen to the defect state and reduction of the negative effects of these states. It is relatively well known that efficiency (electron-photon conversion) is reduced in LEDs due to surface defect states. Thus by exposing the materials, components, partially assembled or completely assembled LEDs to hydrogen, a reduction of the negative effects of these defect states improves the efficiency of an LED. LED components include at least one glass cover, at least one quantum dot, at least one nanoparticle, at least one quantum dot layer, at least one nanoparticle layer, at least one cathode, at least one electron transport layer, at least one emission layer, at least one hole transport layer, at least one hole injection layer, at least one anode, at least one substrate, at least one intermediate layer, and at least one metal layer. In some embodiments an emission layer includes at least one quantum dot.

Many suitable sources of hydrogen are known in the art. Hydrogen sources include gas canisters or tanks, gas candles, and forming gas. Additional hydrogen sources include solvents, adhesives, organic acids, fossil fuels, and fuel cells (metal hydride for example). Some hydrogen sources may be directly applied, while other hydrogen sources are placed in the vicinity of the fabrication or encapsulation methods and the hydrogen gasses from the solvent or other hydrogen source. It should be appreciated that hydrogen concentrations should be limited as a result of the combustibility of hydrogen. To reduce the risk of explosion, hydrogen concentrations of less than 18% are recommended. Notwithstanding, in at least one embodiment the materials, components, partially assembled, or completely assembled LEDs are exposed to a hydrogen concentration is 20% or less. Hydrogen is normally mixed with one or more gases in order to maintain the concentrations below explosive levels. In at least one embodiment the hydrogen atmosphere is a mixture of hydrogen gas and at least one other gas, a mixture of hydrogen gas and nitrogen gas, a mixture of a hydrogen gas and a noble gas, or combinations thereof. Exposure time of the materials, components, partially assembled LEDs, or completely assembled LEDs may vary based on preference, but it has been found that longer hydrogen exposure times have a greater effect on improving the efficiency of devices. In at least one embodiment, the period of exposure time is at least thirty minutes, is at least twelve hours, or is at least twenty four hours. It is appreciated that exposure times may be increased for any duration of time and that certain materials or components would benefit from such exposure thus further improving the efficiency and potentially increasing the lifetime of a particular device. Hydrogen exposure may occur in the presence of an argon or forming gas environment.

Baking the materials, components, a partially assembled LED, or a completely assembled LED has shown some additional benefits and aids in the process of increasing the performance and efficiency of the device. Thus in some embodiments of the inventive process the materials, components, partially assembled LEDs, or completely assembled LEDs are baked for a period of baking time. Similar to the hydrogen exposure different bake times have provided improved results. In at least one embodiment the period of baking time is at least thirty minutes, at least twelve hours, or at least twenty four hours. In addition, the baking of the materials, components, partially assembled LEDs, or completely assembled LEDs have been tested at various temperatures, but bake temperatures should be limited especially since the explosive nature of hydrogen. In at least one embodiment the materials, components, partially assembled LEDs, or completely assembled LED baking occurs at a temperature less than 150° C.

Some embodiments further include exposing the materials, components, partially assembled LEDs, or completely assembled LEDs to an amount of water, thus further improving the performance and efficiencies of an LED. In at least one embodiment, one or more components of an LED, partially assembled LEDs, or completely assembled LEDs are exposed to an amount of water while exposing to an amount of hydrogen or hydrogen gas, or to an atmosphere containing higher quantities of hydrogen or hydrogen gas. It is appreciated that the water and hydrogen exposure can also be combined with baking, thus including all inventive processes disclosed herein. Thus, in at least one embodiment one or more components of LEDs, partially assembled LEDs, or completely assembled LEDs are exposed to an amount of water, to baking, to an amount of hydrogen or hydrogen gas, or to an atmosphere containing higher quantities of hydrogen or hydrogen gas.

It is understood that defect states in materials and components occur in a number of fabrication processes. It is thus appreciated that fabricating certain components in a hydrogen atmosphere further improve performance and efficiencies of LEDs. In at least one embodiment, one or more quantum dots, after synthesis, is exposed to activated hydrogen generated by reactive metal and weak acid. In at least one embodiment, one or more quantum dots are purified in hydrogen environment. In some embodiments the components of an LED are fabricated in a hydrogen environment. In at least one embodiment quantum dots were synthesized in a hydrogen atmosphere. In at least one embodiment, quantum dot after synthesis is exposed to activated hydrogen generated by reactive metal and weak acid. "In at least one embodiment, quantum dot after synthesis is exposed to hydrogen generated by placing the one or more quantum dots in the presence of a solvent or other hydrogen source.

In at least one embodiment zinc oxide nanoparticles were synthesized in a hydrogen atmosphere. In some embodiments, the LEDs are assembled or partially assembled in a hydrogen environment. In another approach, in-situ hydrogenation of quantum dots can be done by generating hydrogen in the reactor after quantum dot synthesis. Hydrogen can be generated using reactive metal and weak acids [Note: strong acid (mineral/inorganic acids) reacts/dissolves/corrodes QDs]. Any metals which are electropositive than hydrogen can be used as a metal source; these metal sources include alkali metals, alkaline earth metals, zinc, aluminum etc. Aliphatic or aromatic carboxylic acids and alcohol and can be used as acid source. Aliphatic mono-carboxylic acid such as methanoic acid, ethanoic acid; dicarboxylic acid such as ethanedioic acid, propanedioic acid; aromatic carboxylic acid such as benzoic acid and their derivatives can be used as an acid. Alcohol can be used as an acid when very reactive metal like sodium or potassium are used for hydrogen generation.

Other embodiments provide for a method for recovery of degraded light emitting diode (LED). It is appreciated that certain LEDs have lower performance characteristics as a result to fluctuations or inconsistencies in the fabrication process of the LED components. In addition, it is further appreciated that LEDs degrade over time as a result of prolonged use. Additional factors which may cause degradation of an LED include the amount of electrical current through the LED, $i^2R$ losses, or the ambient temperature which an LED is used. Recovery is achieved by exposure of a degraded LED, partially assembled degraded LED, or a completely assembled degraded LED to an amount of hydrogen, hydrogen gas or activated hydrogen, or to an atmosphere containing higher quantities of hydrogen, hydrogen gas or activated hydrogen, wherein said exposing occurs for a period of component exposure time. In at least one embodiment baking, or exposure to a water source is similarly used.

It should be understood by those skilled in the art that the methods and kits described herein may be used for any type of LED or degraded LED. In some embodiments, the LED or degraded LED is a quantum dot LED (QD LED). In other embodiments the LED or degraded LED is an organic LED (OLED). While in other embodiments, the LED or degraded LED is an inorganic LED.

EXAMPLES

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

Example 1—Quantum Dot Synthesis in Hydrogen Atmosphere

The following quantum dot synthesis was performed in a glove box containing 18% hydrogen and 82% nitrogen gases. 0.2 mmol of CdO, 4 mmol of zinc acetate and 5 ml of oleic acid (OA) were placed in a 50 ml flask and heated to 170° C. in flowing high-purity argon for 30 min. Then 15 ml of 1-octadecene (ODE) was added to the flask and the temperature was elevated to 300° C. A stock solution containing 0.1 mmol of Se and 3.5 mmol of S dissolved in 2 ml of trioctylphosphine (TOP) was quickly injected into the flask. The reaction temperature was kept for 10 min and then cooled to room temperature. The resulting quantum dots (QDs) were washed several times and finally dispersed in toluene. The relative ratios of the precursors were varied in order to form QDs with different emissions and nanostructures. For a typical synthesis of Cd1-xZnxS/ZnS QDs, the procedure is the same as described above, except that the stock solutions were injected twice. First, the sulfur powder dissolved in ODE was quickly injected into the flask and the temperature was increased to 310° C. After 8 min of reaction, sulfur powder dissolved in TOP was then introduced into the reactor for ZnS shell growth of 40 min at 310° C., and then cooled to room temperature.

Example 2—Quantum Dot LED Assembly in Hydrogen Atmosphere

A quantum dot LED (QD-LED) was assembled in an environment having elevated hydrogen concentrations. The QD-LED is shown schematically in FIG. 1, and consists of an indium-tin oxide (ITO) transparent anode on a glass substrate, a poly(3,4-ethylenedioxythiophene):polystyrene sulphonate (PEDOT:PSS)hole injection layer, a poly(9,9-dioctylfluorene-co-N-(4-(3-methylpropyl))diphenylamine) (TFB) hole transport layer, quantum dots as the emissive layer, an electron transport layer of ZnO nanoparticles and an aluminum (Al) cathode.

Example 3—ZnO Film Exposure in Hydrogen Atmosphere

Figure 1:
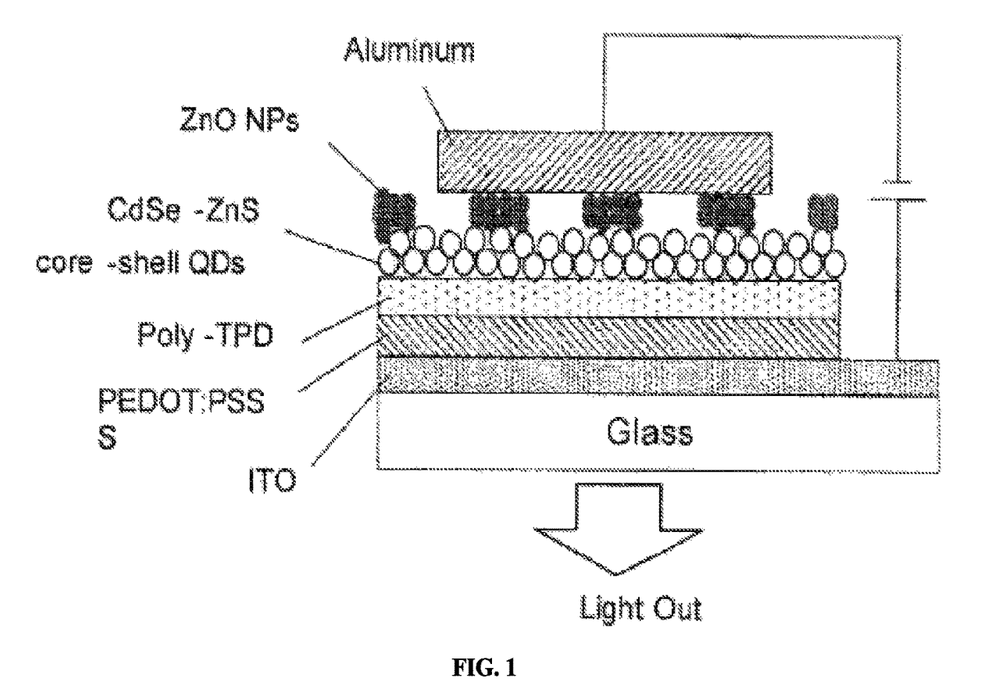
FIG. 1 shows a schematic of the structure of a quantum dot (QD) LED with a nanoparticulate electron injection layer according to an embodiment of the invention.
Figure 2:
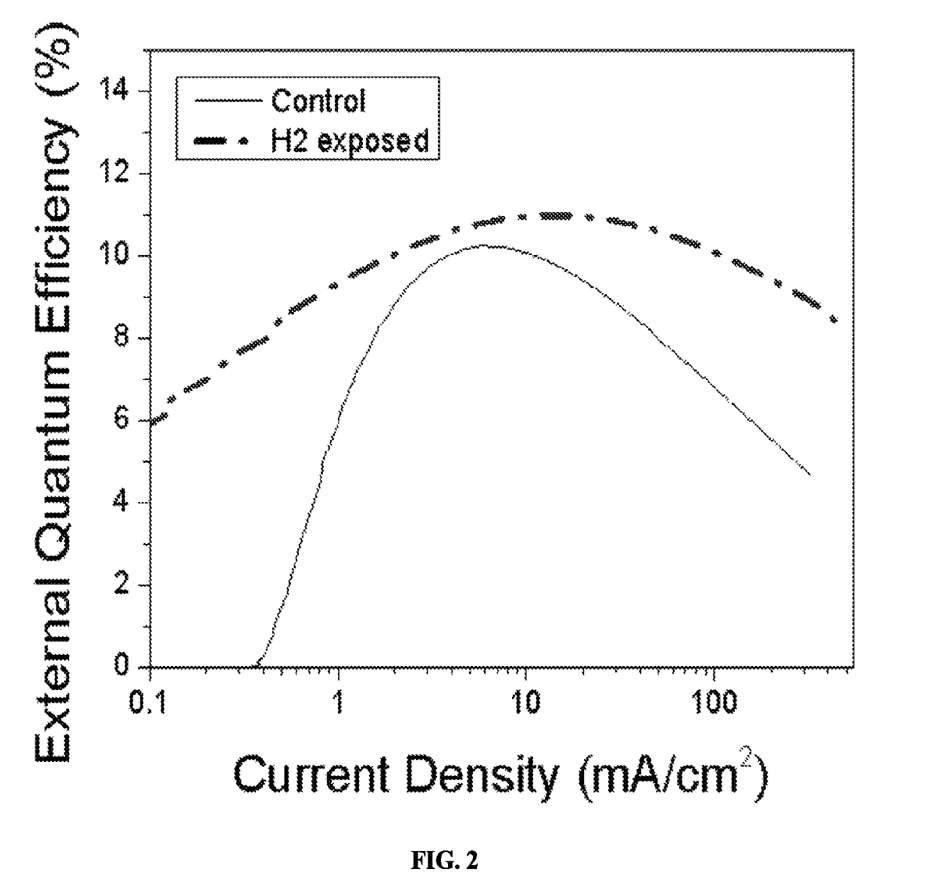
FIG. 2 shows the reduced roll-off in efficiency after ZnO film exposure to hydrogen which is an indicator for improved charge balance. Good charge balance (between electrons and holes) is imperative for higher efficiencies and longer lifetimes in LEDs.

An LED including an electron transport layer of a zinc-oxide (ZnO) film was assembled in a high purity nitrogen glove box environment, other than the ZnO film being exposed to a hydrogen environment for at least 12 hours. The procedure for exposing the ZnO film to hydrogen involves some additional steps beyond typical LED assembly. First, the QD-LED is assembled up through the ZnO NPs layer. FIG. 1 depicts the layers included, but the aluminum cathode is not yet deposited. After the ZnO layer is deposited, the unfinished device is placed in a polycarbonate chamber and then sealed such that the atmosphere in the chamber is the same as in the glove box. Then, the polycarbonate chamber is removed from the glove box and evacuated to a pressure of ~10 mbar for 5 minutes. The polycarbonate chamber is then back-filled with a mixture of nitrogen and hydrogen gas for a given period of time. Finally, the polycarbonate chamber is brought back inside the glove box and the aluminum cathode is deposited. The external quantum efficiency as a function of current density is shown in FIG. 2 as compared to an identical device not assembled in an elevated hydrogen environment.

Example 4—Quantum Dot LED Exposure to Hydrogen Atmosphere after Assembly

The QD-LED of Example 2 was assembled in a high-purity glove box environment. Upon the completion of the LED assembly, the LED was exposed to a forming gas containing 20% hydrogen within a polycarbonate chamber for a period greater than 24 hours. A surprising result was observed of increased external quantum efficiency, increased luminance and lifetime, thus showing positive aging affects with hydrogen treatment. Similar results were observed by exposing partially assembled LEDs to a similar environment.

Figure 5:
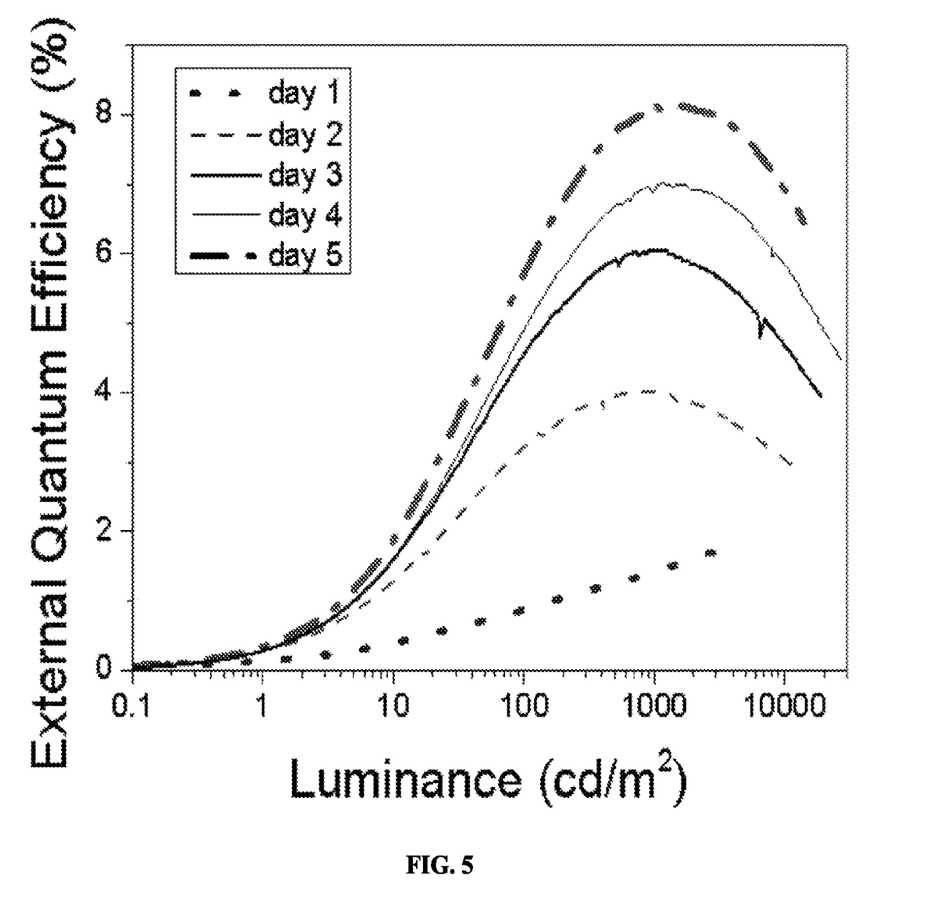
FIG. 5 illustrates external quantum efficiency data from a device exposed to hydrogen and then encapsulated with a non-acidic UV-cure resin.

Example 5—Partially Assembled Quantum Dot LED Exposure to Hydrogen Atmosphere The QD-LED of Example 2 was assembled in a high-purity glove box environment. Prior to the completion of the LED assembly, the LED was exposed to a forming gas containing 20% hydrogen within a polycarbonate chamber for a period greater than 24 hours device then encapsulated with a non-acidic UV-cure resin. The external quantum efficiency as a function of luminance for the assembled LED is shown over a five day period after assembly in FIG. 5. A surprising result was observed of increased external quantum efficiency, increased luminance and time, thus showing positive aging affects with hydrogen treatment. No water was intentionally introduced into the atmosphere during exposure and the hydrogen was not activated.

Figure 6:
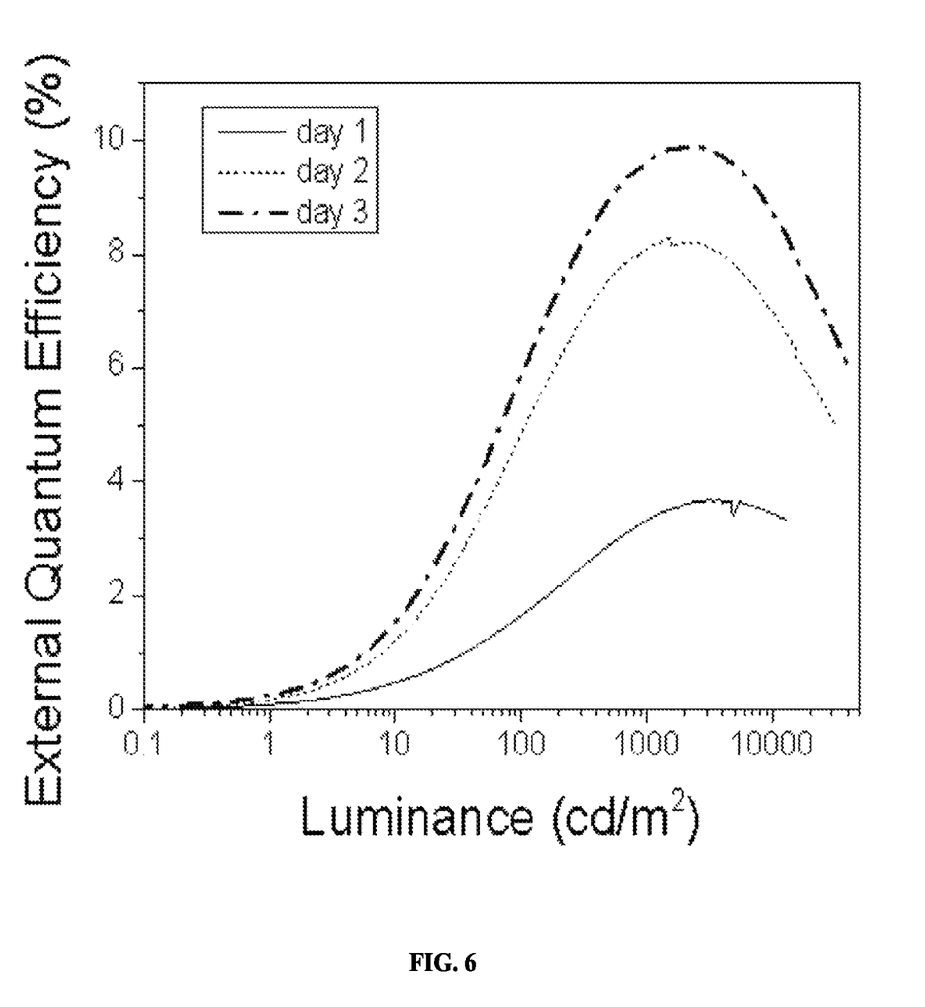
FIG. 6 illustrates external quantum efficiency data from a device exposed to hydrogen and then encapsulated with a non-acidic UV-cure resin and baked for a period of time after encapsulation.
Figure 7A:
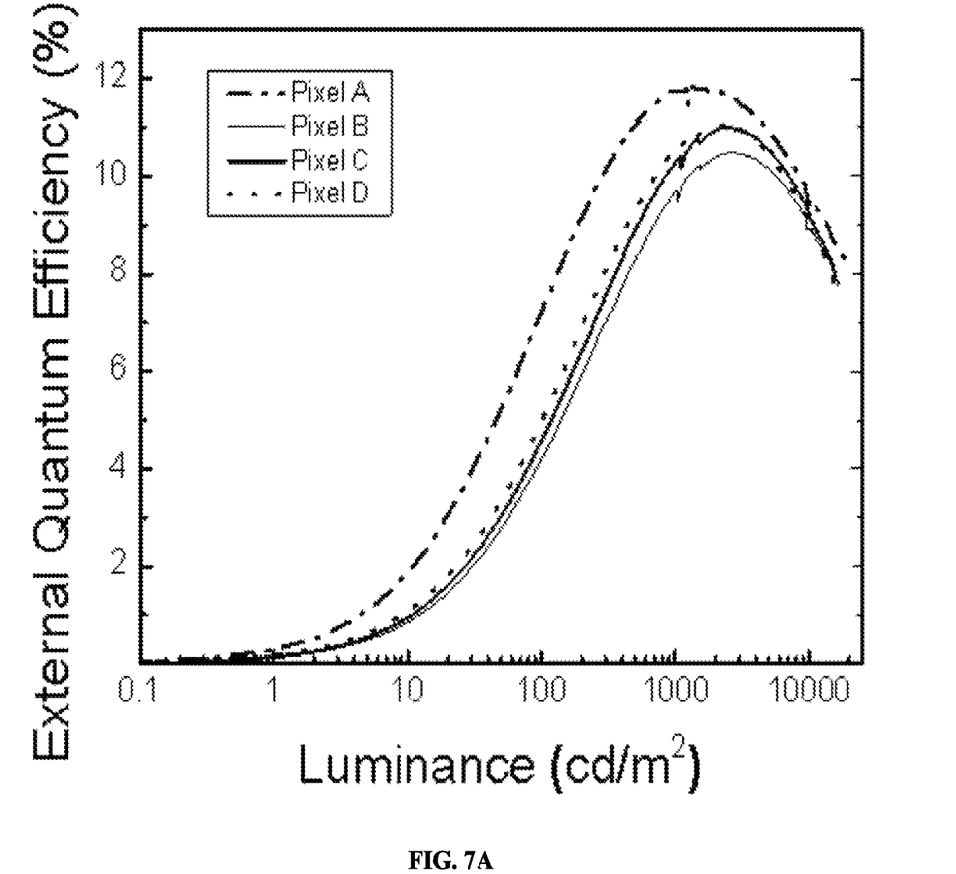
FIG. 7A depicts typical spread in device performance with typical encapsulation.
Figure 7B:
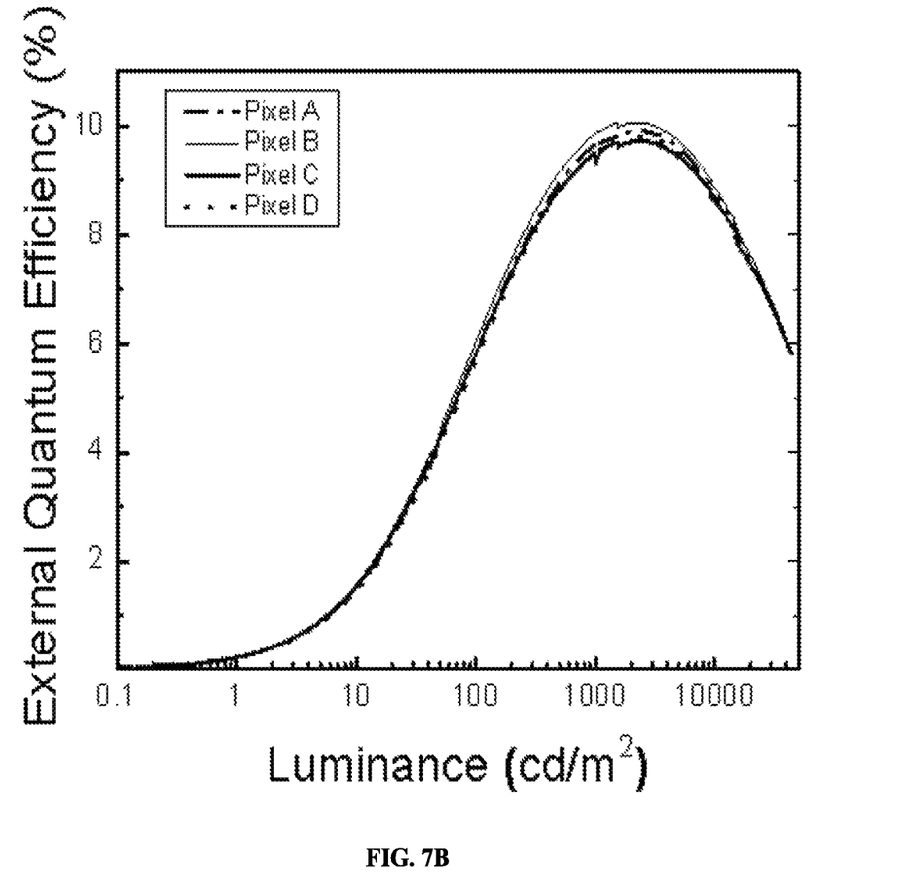
FIG. 7B depicts spread in device performance with hydrogen treatment (encapsulated then baked).

Example 6—Partially Assembled Quantum Dot LED Exposure to Hydrogen Atmosphere Example 5 was repeated with the additional step of baking the LED for a period of time after encapsulation with a non-acidic UV-cure resin. The external quantum efficiency as a function of luminance for the assembled LED is shown over a five day period after assembly in FIG. 6. FIG. 7A depicts typical spread in device performance with typical encapsulation. FIG. 7B depicts spread in device performance with hydrogen treatment (encapsulated then baked). A surprising result was observed with the additional baking step accelerating the positive aging to a moderate extent in comparing FIG. 7 to FIG. 6.

Figure 3:
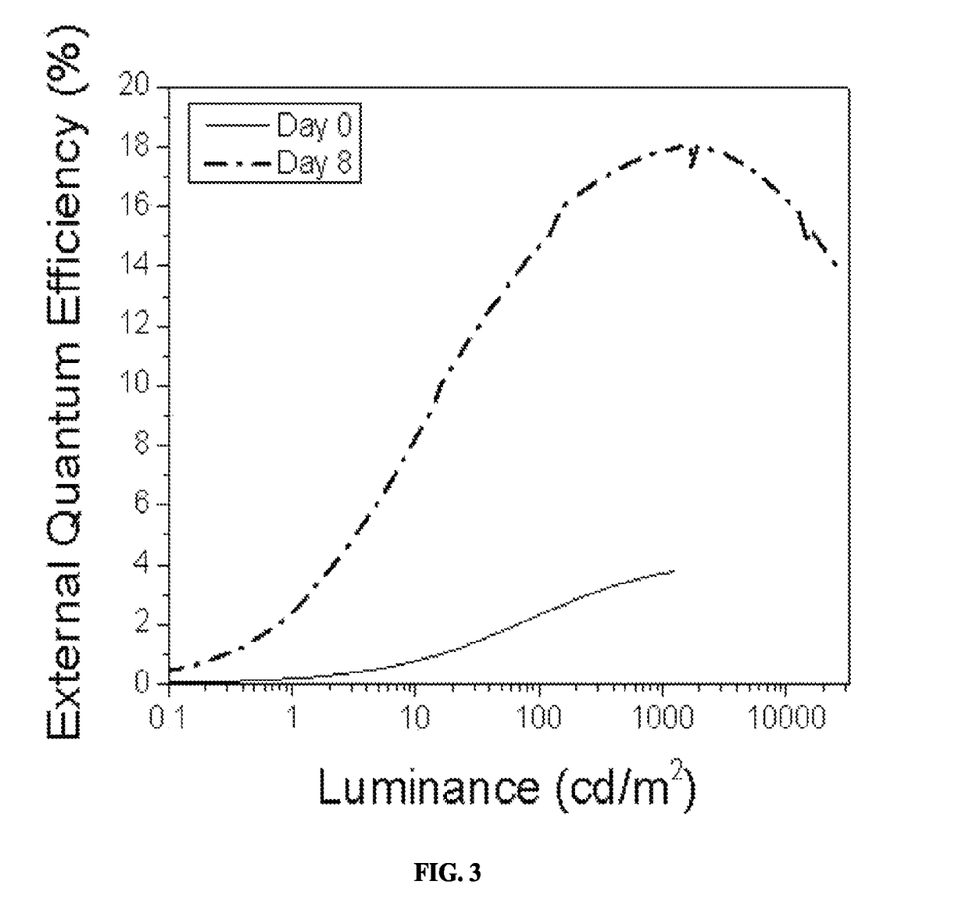
FIG. 3 depicts the best efficiency achieved in a completed device after hydrogen exposure and water exposure.

Example 7—Quantum Dot LED Exposure to Hydrogen Atmosphere and Water after Assembly The QD-LED of Example 2 was assembled in a high-purity glove box environment. Upon the completion of the LED assembly, the LED was exposed to a forming gas containing 20% hydrogen within a polycarbonate chamber for a period greater than 24 hours. During this same period, a small vial of water was additionally present in the polycarbonate chamber. The external quantum efficiency as a function of luminance for the assembled LED is shown in FIG. 3, as compared to an identical device not exposed to a hydrogen and water environment. A surprising result was observed with improved changes in efficiency over time, thus showing positive aging affects with hydrogen and water treatment. Similar results were observed by exposing partially assembled LEDs to a similar environment. Other experiments were performed varying the amount of water used. Detrimental effects were observed for higher concentrations of water being used.

Figure 4:
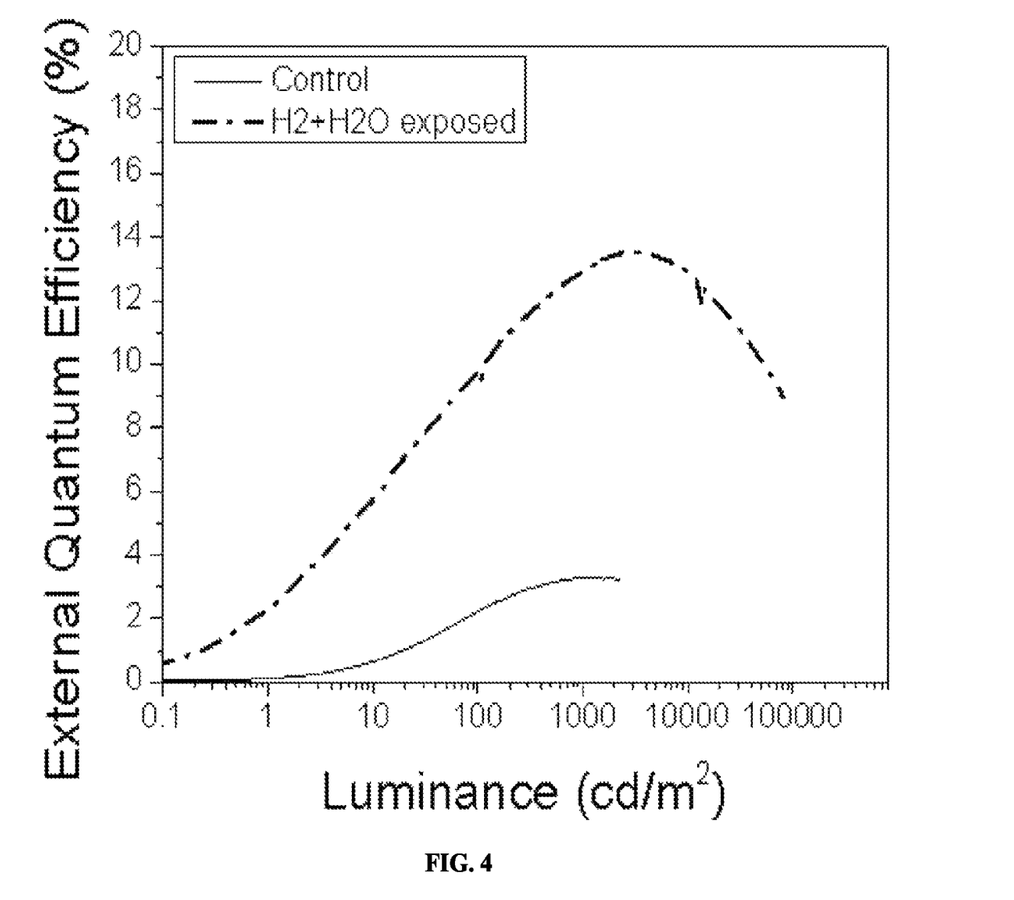
FIG. 4 illustrates a positive aging effect in addition to little-to-no non-uniformity in emission after exposing a completed LED device using degraded quantum dots.

Example 8—Degraded Quantum Dot LED Exposure to Activated Hydrogen Atmosphere after Assembly The QD-LED of Example 2 was assembled in a high-purity glove box environment using degraded quantum dots. Upon the completion of the LED assembly, the LED was exposed to a forming gas containing 20% hydrogen within a polycarbonate chamber with a mercury discharge lamp emitting light with a 254 nm wavelength generating an amount of activated hydrogen within the environment. The lamp was left on for 4 hours but the QD-LEDs remained in the chamber for an additional 12 hours. The external quantum efficiency as a function of luminance for the assembled LED is shown in FIG. 4 as compared to an identical device not exposed to an activated hydrogen environment. A surprising result was observed with improved changes in efficiency, thus showing positive effects with the activated hydrogen treatment. Similar results were observed by exposing partially assembled LEDs to a similar environment.

Example 9—Quantum Dot LED Encapsulated with Hydrogen Atmosphere after Assembly The QD-LED of Example 2 is assembled in a high-purity glove box environment. Upon the completion of the LED assembly, the LED was encapsulated with a cavity glass in a hydrogen environment to create a standing Hydrogen environment. A surprising result was observed of a maintained increased external quantum efficiency, increased luminance and lifetime, thus showing positive aging affects with hydrogen treatment.

Example 10—Quantum Dot LED Encapsulated with Hydrogen Source after Assembly

The QD-LED of Example 2 is assembled in a high-purity glove box environment. Upon the completion of the LED assembly, the LED is encapsulated with a cavity glass in a hydrogen environment containing a metal hydride fuel cell for continued Hydrogen production and exposure. A surprising result was observed of a maintained increased external quantum efficiency, increased luminance and lifetime, thus showing positive aging affects with hydrogen treatment.

OTHER EMBODIMENTS

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the described embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

Patent documents and publications mentioned in the specification are indicative of the levels of those skilled in the art to which the invention pertains. These documents and publications are incorporated herein by reference to the same extent as if each individual document or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

The invention claimed is:

1. A method for improving the efficiency of a light emitting diode (LED), the method comprising: exposing one or more completely assembled LED after assembly to an amount of hydrogen or hydrogen gas, or to an atmosphere containing higher quantities of hydrogen or hydrogen gas, wherein said exposing occurs for a period of exposure time.

2. The method of claim 1 wherein said amount of hydrogen is a mixture of hydrogen gas and at least one other gas.

3. The method of claim 1 wherein said hydrogen concentration is less than 20%.

4. The method of claim 1 wherein said period of exposure time is at least thirty minutes.

5. The method of claim 1 further comprising baking said one or more completely assembled LED for a period of baking time.

6. The method of claim 1 wherein said period of baking time is at least thirty minutes, at least twelve hours, or at least twenty four hours.

7. The method of claim 1 wherein said baking occurs at a temperature less than 150° C.

8. The method of claim 1 wherein said one or more completely assembled LED is a quantum dot LED (QD-LED).

9. A method for constructing a light emitting diode, the method comprising:
obtaining one or more components of an LED after said one or more components have completed their respective fabrication process;
exposing said one or more components of an LED to an amount of hydrogen, wherein said exposing occurs for a period of component exposure time;
assembling said one or more exposed components to form a partially assembled LED after said period of component exposure time is completed; and
exposing said partially assembled LED to an amount of hydrogen;
wherein said one or more components of the LED is selected from the group consisting of a glass cover, quantum dots, nanoparticles, a quantum dot layer, a nanoparticle layer, a cathode, an electron transport layer, an emission layer, a hole transport layer, a hole injection layer, an anode, a substrate, one or more an intermediate layers, one or more metal layers, or combinations thereof.

10. The method of claim 9, wherein said emission layer comprises quantum dots.

11. The method of claim 9 wherein said amount of hydrogen is a mixture of hydrogen gas and at least one other gas.

12. The method of claim 9 wherein said hydrogen concentration is less than 20%.

13. The method of claim 9 wherein said period of exposure time is at least thirty minutes.

14. The method of claim 9 further comprising baking said one or more components of an LED or partially assembled LED, or completely assembled LED for a period of baking time.

15. The method of claim 9 wherein said period of baking time is at least thirty minutes.

16. The method of claim 9 further comprising assembling said partially assembled LED with one or more said exposed components to form a completely assembled LED and exposing said completely assembled LED to an amount of hydrogen.

* * * * *